United States Patent
Kooijman et al.

(10) Patent No.: US 8,288,724 B2
(45) Date of Patent: Oct. 16, 2012

(54) DARK FIELD DETECTOR FOR USE IN AN ELECTRON MICROSCOPE

(75) Inventors: Cornelis Sander Kooijman, Veldhoven (NL); Gerardus Nicolaas Anne van Veen, Waalre (NL); Albertus Aemillius Seyno Sluijterman, Eindhoven (NL)

(73) Assignee: FEI Company, Hillsboro, OR (US)

( * ) Notice: Subject to any disclaimer, the term of this patent is extended or adjusted under 35 U.S.C. 154(b) by 242 days.

(21) Appl. No.: 12/630,687

(22) Filed: Dec. 3, 2009

(65) Prior Publication Data
US 2010/0258721 A1 Oct. 14, 2010

(30) Foreign Application Priority Data
Dec. 3, 2008 (EP) .................................... 08170561

(51) Int. Cl.
*G01N 23/207* (2006.01)
*G01N 23/20* (2006.01)
*G01N 23/00* (2006.01)

(52) U.S. Cl. ........ 250/311; 250/306; 250/307; 250/309; 250/310; 250/492.1; 250/492.2; 250/493.1

(58) Field of Classification Search .................. 250/306, 250/307, 309, 310, 311, 396 R, 397, 396 ML, 250/492.1, 492.2, 493.1
See application file for complete search history.

(56) References Cited

U.S. PATENT DOCUMENTS

| 4,691,103 | A  | 9/1987  | Le Poole et al. |
| 5,866,905 | A  | 2/1999  | Kakibayashi et al. |
| 6,376,839 | B1 | 4/2002  | Hayles et al. |
| 6,646,261 | B2 | 11/2003 | Krans |
| 7,141,791 | B2 | 11/2006 | Masnaghetti et al. |

FOREIGN PATENT DOCUMENTS

| GB | 2019691    | 8/1982  |
| JP | 2004361283 | 12/2004 |

OTHER PUBLICATIONS

Funsten, H.O., et al., 'Response of 100% Internal Quantum Efficiency Silicon Photodiodes to 200 eV-40 keV Electrons,' IEEE Transactions on Nuclear Science, Dec. 1997, pp. 2561-2565, vol. 44, No. 6.

*Primary Examiner* — Michael Maskell
*Assistant Examiner* — Hanway Chang
(74) *Attorney, Agent, or Firm* — Scheinberg & Associates, PC; Michael O. Scheinberg (57) ABSTRACT

The invention relates to a dark-field detector for an electron microscope. The detector comprises a photodiode for detecting the scattered electrons, with an inner electrode and an outer electrode. As a result of the resistive behavior of the surface layer the current induced by a scattered electron, e.g. holes, are divided over the electrodes, so that a current $I_1$ and $I_2$ is induced, the sum of the current proportional to the energy of the impinging electron and the normalized ratio a function of the radial position where the electron impinges.

13 Claims, 7 Drawing Sheets

DARK FIELD DETECTOR FOR USE IN AN ELECTRON MICROSCOPE

The invention relates to a detector for use as a dark field detector in a particle optical apparatus, said apparatus producing a beam of particles along a particle-optical axis for inspecting a sample, the detector showing a substantially annular area sensitive to impinging particles, said substantially annular area arranged around a detector centre, the detector centre intended to be positioned on the particle-optical axis of the particle-optical apparatus, the impinging particles causing the formation of positive and negative charge carriers in the detector, one type of charge carriers collected by a signal electrode, thus forming a signal proportional to the amount and the energy of the impinging particles.

The invention further relates to a method of using such a detector.

Such a detector is known from U.S. Pat. No. 5,866,905.

Dark-field detectors are used in particle-optical apparatus such as a Scanning Transmission Electron Microscope (STEM) and a Scanning Electron Microscope (SEM). In a STEM and a SEM a finely focused beam of electrons is scanned over a sample. The impinging electrons cause secondary radiation to be emitted in the form of e.g. secondary electrons, backscattered electrons and X-rays. If the sample is sufficiently thin and the electrons are sufficiently energetic some of the electrons are transmitted through the sample. A fraction of the transmitted electrons is scattered by the sample while the rest of the transmitted electrons passes through the sample unhindered. The scattered electrons can be detected by a so-named dark-field detector.

The difference between a STEM and a SEM is that in a STEM a projection system forms an enlarged image of the sample using the transmitted electrons, while a typical SEM lacks such an imaging system. Another difference between a STEM and a SEM is the typical electron energy used: in a typical STEM the electrons irradiating the sample have an energy above 50 keV, and that in a SEM the electrons typically have an energy of 50 keV or less. However, STEM's using an energy below 50 keV are known, and also SEM's using an energy above 50 keV are known.

The average angle under which the electrons are scattered is a function of electron energy and sample composition (especially the atomic number Z of the sample material). Determining the average angle under which the electrons are scattered thus offers information concerning the composition of the material.

U.S. Pat. No. 5,866,905 describes several embodiments of dark-field detectors. They all comprise a scintillator and an imaging device of which the contour of the signal detection area ("photodetection area") is set by e.g. selecting pixels of the CCD (column 6, lines 28-33), as a result of which only electrons scattered in a selected scatter range (that is: between a selected minimum scatter angle $\alpha_{min}$ and a selected maximum scatter angle $\alpha_{max}$) are detected. This implies that the contour is an annular contour.

All detectors disclosed in the known patent use a scintillator to convert electrons to photons, followed by the detection of photons and subsequent processing thereof.

A disadvantage of the use of scintillators is that the conversion of electrons to light limits the signal to noise ratio: the amount of photons generated by an electron varies for different events and different positions on the scintillator. As this "noise" is introduced at the first step of the detection chain, any analogue processing of the signal cannot remove this signal degradation.

The known patent shows in FIG. 17 and the corresponding description a CCD to detect the photons imaged thereupon. By detecting the signal of a number of pixels that form an annulus on the CCD, or more precise, that correspond with an annular surface of the scintillator, the amount of electrons impinging on said annulus is detected.

A disadvantage associated with the known CCD type detector is that part of the surface of the CCD is inactive due to the spacing of the pixels, resulting in a lower effective efficiency of the detector. This is especially the case when using high-resolution CCD's, which exhibit a large number of small pixels, and thus a larger inactive area than a similar detector with fewer pixels that are larger.

Another disadvantage associated with the known CCD type detector is that, when forming images at a frame rate of e.g. 50 Hz, the so-named read-out noise may be a limiting factor.

Yet another disadvantage of the known CCD type detector is that the pixels on the centre of the detector intercept the unscattered electrons. This may result in a large signal detected by the central pixel(s), giving rise to so-named blooming effects of the CCD. Although it is known to the person skilled in the art that drain structures can reduce blooming effects, this introduces extra surface area that is not sensitive to light, and thus a reduced effective sensitivity of the detector.

The known patent shows in FIG. 20 and corresponding description that the setting of the contour may alternatively be done by selectively blocking selected opening angles for the electrons by beam stops in front of a radiation sensitive area, leaving a substantially annular area on the radiation sensitive surface. Changing the detection area involves mechanically changing the beam stops.

A disadvantage of the known detectors is that electrons in the selected scatter range are detected without further discrimination to the scatter angle, and that electrons with a scatter angle outside the selected scatter range are not detected at all. Therefore only a part of the electrons, the electrons scattered over an angle within the selected scatter range $\alpha_{min}$ to $\alpha_{max}$, are detected and the rest of the electrons are not detected, resulting in a loss of the signal contained in the other electrons. This is especially the case when a high resolution in scatter angle is needed, corresponding to a small scatter range.

Another disadvantage of the known detector equipped with a mechanical beam stop is that changing the scatter range includes a mechanical exchange of the beam stops, which is time consuming and demands a complicated and thus expensive structure of the detector.

The known patent shows in FIG. 22 and corresponding description a beam stop defining an annular transparent area combined with a multitude of electron optical lenses so that the scatter range can be selected by changing the strength of these electron-optical lenses, effectively changing the magnification with which the beam stop is imaged on the detector.

A disadvantage of this embodiment is that it comprises several electron-optical lenses, resulting in a complex design and an expensive detector. Also, it may result in a rather bulky detector, that may not be incorporated with many existing SEM and STEM designs.

A disadvantage of the known detectors, combining a scintillator, a detector in the form of e.g. a CCD and possibly a mechanical beam stop, is that the resulting detector is of a complex design and therefore the known detector is expensive.

Another disadvantage of the known detectors is that, when using a high resolution, only a small fraction of the particles is detected, and most information is not available. Especially when demanding a high resolution of the scatter angle, which in the known detector corresponds with a small scatter range $\alpha_{min}$ to $\alpha_{max}$, an thus a thin annulus, most particles are not detected.

There is a need for a detector with a simpler design giving improved information about the angular distribution of the impinging particles.

To that end the detector according to the invention is characterized in that said one type of charge carriers is collected by at least two signal electrodes forming two main signals, $S_1$ and $S_2$, the first signal electrode formed at the inner radius of the annular surface area and the second signal electrode formed at the outer radius of the annular surface area, as a result of which a part of said one type of charge carriers, caused by an impinging particle, flows to the first signal electrode forming a main signal $S_1$ and a part of said one type of charge carriers flows to the second signal electrode forming a main signal $S_2$, the sum of the main signals, $S_1+S_2$, proportional to the amount and the energy of the particles impinging on the annular surface, and the normalized difference of the main signals, $(S_1-S_2)/(S_1+S_2)$, a function of the average distance from the detector centre to the position where the particle impinges on the annular surface.

The detector according to the invention not only detects whether a particle, such as an electron, is within a scatter range, but provides information of the scatter angle itself. This results in improved quality of information.

An advantage is that in the detector according to the invention resolution and sensitive area are decoupled: within a large scatter range the scatter angle may be determined with a high accuracy.

Also, the design of the detector is much simplified. No mechanical parts for forming and positioning the beam stops are necessary to define a scatter range.

It is noted that the person skilled in the art could configure the known CCD-detector so that a number of rings is formed to detect simultaneously a number of scatter ranges under which the electrons are scattered. To offer sufficient angular resolution such a CCD should comprise a large number of pixels. For a fast read-out time of the detector an extremely fast pixel read-out of the CCD is needed, resulting in a large read-out noise and thus a low signal-to-noise ratio. Also, the image processing in the form of addition of the pixels to form the 'rings' demands fast processing of the data. Further, using a CCD blooming due to a large intensity at e.g. the centre of the detector may necessitate a fast read-out time, even when this results in added noise.

It is further noted that another type of dark field detector is known from U.S. Pat. No. 6,376,839. In this patent a detector with a mechanical beam stop is described in which, by mechanically tilting the assembly, electrons within a scatter range $\alpha_{min}$ to $\alpha_{max}$ are detected on one part of the detector, while electrons with another scatter range, preferably including scatter angle $\alpha=0$ (the bright field image), are detected on another part of the detector. Thereby two signals are formed, giving information of the scatter angle. A disadvantage of this detector is that electrons between a minimum and a maximum scatter angle are detected without further discrimination to the scatter angle. Also, electrons scattered under another angle than the (two) scatter ranges are not detected, resulting in a reduced signal-to-noise ratio. Another disadvantage is that to change the scatter range a mechanical tilt of the detector must be changed, which is time consuming and demands a complicated and thus expensive structure of the detector.

In an embodiment of the detector according to the invention the annular surface is divided into sectors, and the two signal electrodes are divided in two sets of sector electrodes, an inner set and an outer set, each sector bordered by one unique sector electrode of the inner set and one unique sector electrode of the outer set, as a result of which each sector producing a corresponding sector signal, and the main signal $S_1$ may be formed by the summation of the signals of the inner sector electrodes and the main signal $S_2$ may be formed by the summation of the signals of the outer sector electrodes.

By dividing the annular surface into segments, further information can be obtained from the sample. Not only the scattering angle, resulting in a radial angle, but also a tangential distribution of the particle intensity can be determined. This enables e.g. crystallographic information resulting from diffraction to be gathered, or to filter out peaks due to diffraction.

It is noted that the summation of the signals can be done by electronic means, such as by summing the signals from amplifiers, but that it may also be done by electrically connecting e.g. the inner signals.

In still another embodiment of the detector according to the invention the annular area is part of a semiconductor diode, and the charge carriers are electron-hole pairs formed in the semiconductor.

The use of semiconductor diodes as detectors to e.g. electrons is known to the person skilled in the art, see e.g. "Response of 100% internal quantum efficiency silicon photodiodes to 200 eV-40 keV electrons", H. O. Funsten et al., IEEE Transactions on nuclear science, vol. 44, no. 6, December 1997. The diode resembles a photodiode with a very thin dead layer on the sensitive side of the diode. The diode comprises two electrodes: one on the back-side (the substrate side) and one on the front side (the radiation sensitive side, which is also the side sensitive to impinging particles), in which electrodes a current is induced in response to impinging radiation such as electrons. By forming such a diode with two front electrodes the induced current will resistively divide between the two front electrodes. The division is due to the resistivity between the place where the current is produced (the position where the radiation impinges) and each of the electrodes.

It is noted that the electron-hole pairs can be made by the impinging particle itself, or that a conversion to photons may be made followed by the detection of the photons with the semiconductor structure. The latter may be beneficial when the particles are sufficiently energetic to cause damage to the semiconductor.

In a preferred embodiment of the detector according to the invention between the electrodes a resistive layer is present with a substantially constant sheet resistance, the annular surface has an inner radius $R_1$ and an outer radius $R_2$, as a result of which the normalized difference of the main signals $S_1$ and $S_2$ is given by:

$$\frac{S_1 - S_2}{S_1 + S_2} = 1 - 2 \cdot \frac{\ln R - \ln R_1}{\ln R_2 - \ln R_1}$$

in which R is the average distance from the centre of the detector to the position where the particles impinge on the annular surface, and $R_1 \leq R \leq R_2$.

the advantage of a detector with a sensitivity with a radial dependency following this formulae is that it shows the same relative sensitivity $\partial R/R$ for both small value of R and large values of R. It will be clear to the person skilled in the art that the angular dependency of the detector $\kappa\alpha/\alpha$ will show the same relative sensitivity.

In another embodiment of the detector according to the invention the detector is further equipped with a bright field detector by forming an additional area sensitive to impinging particles surrounded by the annular surface.

By integrating a bright field detector with the detector according to the invention, both a bright field and a dark field image can be displayed. The bright field detector is formed by an additional area sensitive to impinging particles, but now including the position where the particle-optical axis intersects the detector.

It is noted that, as the sample is scanned by the particle beam, the position where the unscattered particles hit the detector varies. The diameter of the sensitive area is preferably slightly larger than the scan area of the beam projected at the position of the detector.

In another embodiment of the invention a particle-optical apparatus is equipped with a detector according to any of the preceding claims.

In a further embodiment of the invention the particle-optical apparatus is a Scanning Electron Microscope (SEM) or a Scanning Transmission Electron Microscope (STEM).

In an aspect of the invention a method of using a particle-optical apparatus, the method comprising: providing a particle-optical apparatus forming a focused beam of particles along an axis, the focusing done with an objective lens, the apparatus equipped with a dark field detector, providing a sample placed on said axis between the objective lens and the dark field detector, directing the beam of particles towards the sample, and measuring the signal of the dark field detector, is characterized in that the dark field detector is the dark field detector according to the invention, and the average radial position of the particles impinging on the detector is determined using the two main signals.

As known to the person skilled in the art electrons impinging on a thin foil of high-Z material are, on average, scattered over a larger angle than electrons impinging on a foil of low-Z material. A thin foil is in this context a foil in which most of the transmitted particles are scattered only once. By determining the average scatter angle an image can be made in which the intensity of the image corresponds with the average scatter angle, and thus an image in which the intensity corresponds with the (average) atomic number of the sample at the position where the beam hits the sample.

In an embodiment of the method according to the invention the average radial position is used to distinguish between materials of the sample.

By comparing the average scatter angle with e.g. a table of scatter angles obtained for different materials, an image can be constructed showing the different materials.

In another embodiment of the method according to the invention the average radial position is used to estimate the thickness of the sample.

As the thickness of a sample increases, more and more electrons are scattered. Also the change of a scattered electron to be scattered again increases. As a result not only the fraction of the electrons scattered increases, but also the average angle under which the electrons are scattered changes with increased thickness, due to the aforementioned double scattering.

The invention is now elucidated on the basis of figures, in which identical reference numerals indicate corresponding elements. To this end.

Figure 1A:
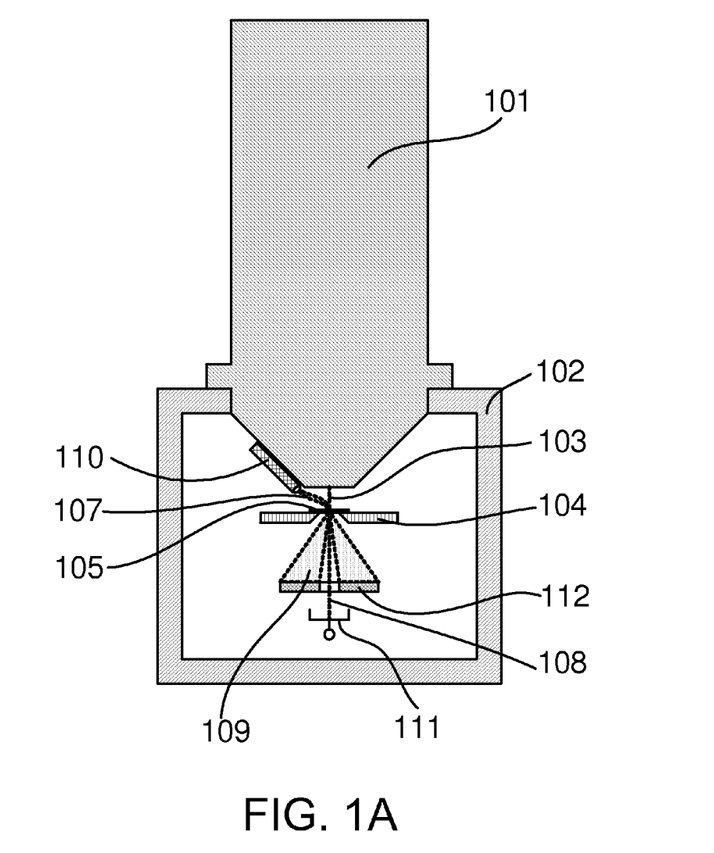
FIG. 1A schematically shows a particle-optical apparatus equipped with a dark field detector, FIG. 1B schematically shows a close-up of the area where the beam impinges on the sample, FIGS. 2A and 2B schematically shows a photodiode according to the invention, FIGS. 3A and 3B schematically shows a sectional view of a combined dark field/bright field semiconductor detector according to the invention.

FIG. 1 schematically shows a particle-optical apparatus equipped with a dark field detector.

A particle-optical apparatus in the form of a Scanning Electron Microscope (SEM) comprises a column 101 producing a beam of particles in the form of a beam of electrons 103. The column 101 is mounted on a vacuum chamber 102, which is evacuated by vacuum pumps (not shown). In the vacuum chamber a sample holder 104 is placed, which holds a sample 105. The sample holder may displace the sample so that an area of interest is irradiated by the beam of electrons.

The column 101 is equipped to focus the beam of particles on the sample and to scan the beam over the sample.

Due to the irradiation of the sample by the beam of particles secondary radiation is formed, such as secondary electrons 107, transmitted electrons that are not scattered, the so-named bright field electrons 108 and transmitted electrons that are scattered, the so-named dark field electrons 109. The secondary electrons 107 are detected by detector 110, which is e.g. an Everhart-Thornley detector. The bright field electrons 108 are detected by a bright field detector 111, while the dark field electrons 109 are detected by a dark field detector 112.

It is noted that often electrons showing a scattering angle less than 10 mrad are classified, together with the unscattered electrons, as bright field electrons, electrons showing a scattering angle between 10-50 mrad are classified as dark field electrons, and electrons scattered over an angle of more than 50 mrad are classified as high-angle dark field electrons. However, in this context the mentioned values must be seen as guidance, and not as limiting values.

In this particular embodiment the dark field detector, which shows an annular shape for detecting all dark field electrons, shows a central through hole for passing the bright field electrons to the bright field detector. Also embodiments in which the bright field detector and the dark field detector are in the same plane are envisaged.

Figure 1B:
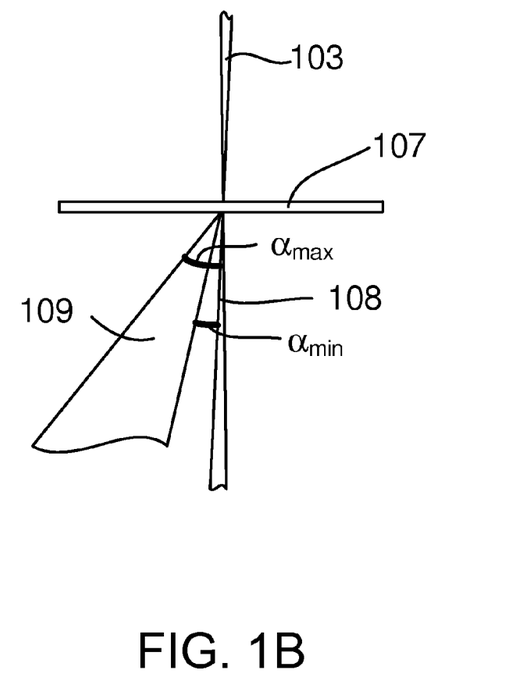

FIG. 1B schematically shows a close-up of the area where the beam impinges on the sample.

The secondary electrons 107 are for simplicity not shown. Beam 103 impinges on the sample 107, and bright field electrons 108 are transmitted through the sample without scattering. Likewise dark field electrons 109 are transmitted through the sample as well, but dark field electrons are scattered. The amount of bright field electrons compared to the amount of electrons impinging on the sample depends on the amount of electrons absorbed in the sample and the amount of electrons scattered away from this beam. Assuming an impinging beam with a constant current, the current in the transmitted beam 108 fluctuates when the beam 103 is scanned over the sample 107, as absorption and scattering vary when the local composition varies. This gives rise to contrast in the image made using the information of the bright field detector.

The dark field detector detects all radiation impinging on it, in this figure corresponding with all electrons scattered over an angle between $\alpha_{min}$ and $\alpha_{max}$. It is noted that the known detectors do not discriminate between any angle between $\alpha_{min}$ and $\alpha_{max}$.

It is mentioned that some electrons transmitted through the sample and scattered by the sample are not detected by the dark field detector, as the angle over which they are scattered is smaller than $\alpha_{min}$ or larger than $\alpha_{max}$. For the known detector, when using a small range of $\alpha_{min}$ and $\alpha_{max}$, this not detected amount of electrons may well be larger than the detected amount.

Figure 2A:
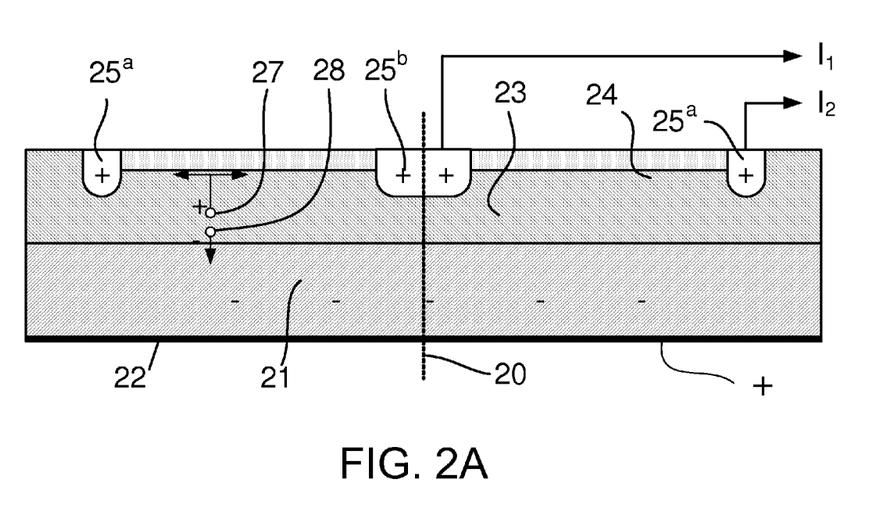
Figure 2B:
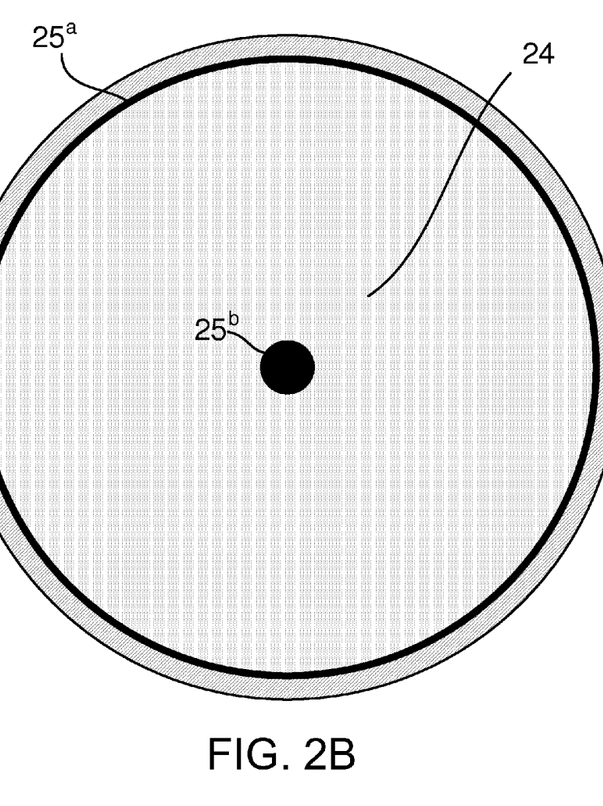

FIG. 2 schematically shows a photodiode according to the invention. A piece of semiconductor material comprises a substrate 21 of n$^+$ type material. The substrate is covered with a metal layer 22 to provide a back contact. On the substrate a n-type epitaxial layer 23 is located. An annulus around axis 20 of said n-type layer is doped so that a p-type surface layer 24 is formed.

Surface layer 24 borders to two heavily doped, low impedance ring electrodes 25a and 25b. Thereby any part of layer 23 shows an electrical impedance to ring electrode 25a and another impedance to ring electrode 25b.

Radiation impinging on the detector from the side of surface layer 24 will generate electron-hole pairs (27-28) in the depletion layer between n-type layer 23 and p-type layer 24. The holes 27 will drift to the p-type material of surface layer 24, while the electrons 28 drift to the n$^+$ type substrate 21. The holes, when entering layer 24, will divide between ring electrodes 25$^a$ and 25$^b$ according to the resistive paths to the ring electrodes. A signal $S_1$ in the form of a current $I_1$ and a signal $S_2$ in the form of a current $I_2$ are thus induced in the ring electrodes 25$^a$ and 25$^b$ respectively.

It is noted that for energetic radiation, such as X-rays, electrons or ions, a large number of electron/hole pairs is formed, as the formation of an electron-hole pair in silicon demands an energy of 3.71 eV. A 10 keV electron can thus generate in excess of 2500 electron/hole pairs.

Preferably the sheet resistance of layer 24 is constant over its surface. Because the generated holes divide over the two ring electrodes, it can be determined on what radius the impinging radiation hit the detector. If the impinging radiation hit the detector close to ring electrode 25$^a$, most of the generated holes will flow to this ring electrode, when the radiation impinges the detector close to ring electrode 25$^b$ most of the generated holes will flow to ring electrode 25$^b$. The ratio of currents $I_1$ and $I_2$ is thus a measure of the radial position.

It is noted that, when the electrode 25$^b$ is transparent to the impinging particles, electron-hole pairs will be generated for the particles transmitted through this electrode. As a result these particles, the bright field particles, are detected as well by the electrode and will form part of signal $I_1$. This may be a desired property of the detector, or it may be an undesired property. In the latter case the electrode can be formed as e.g. a gold electrode, capable of stopping all or most of the impinging particles.

Figure 3A:
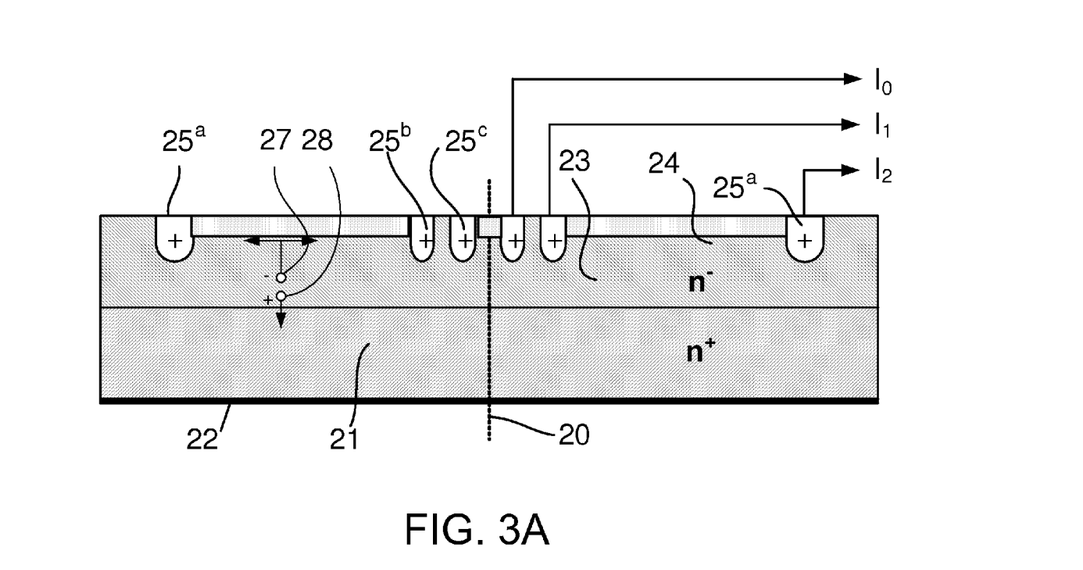
Figure 3B:
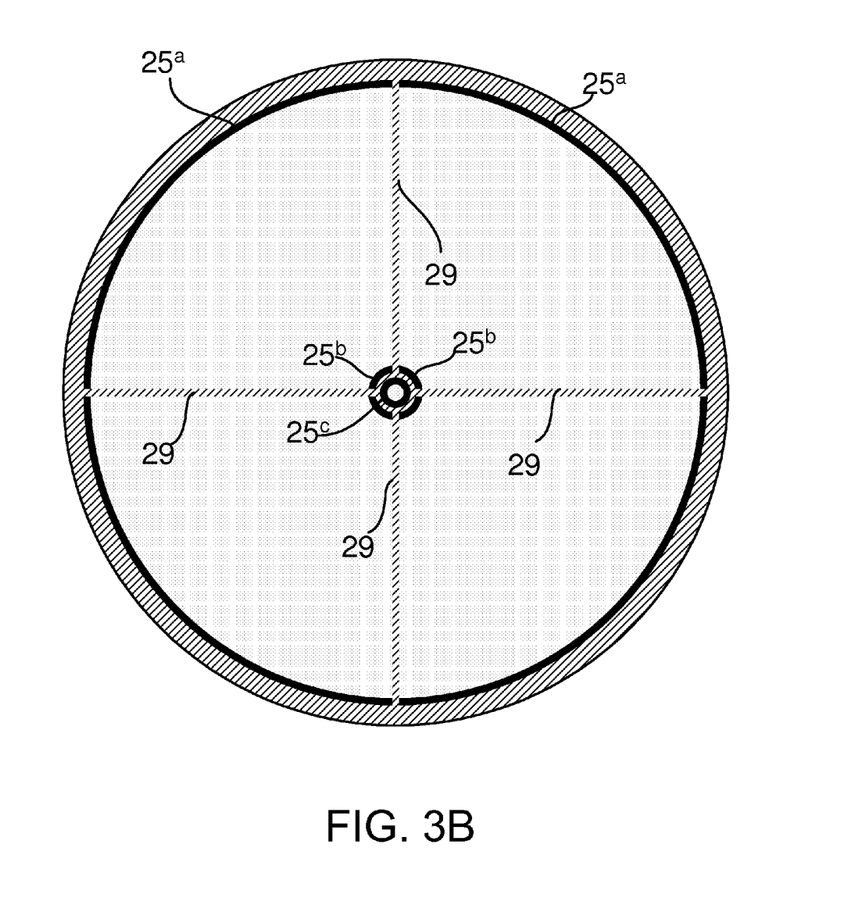

FIG. 3 schematically shows a preferred embodiment in which a dark field detector and a bright field detector are combined, and the dark field detector is formed as a four quadrant detector.

FIG. 3 can be thought to be evolved from FIG. 2. The inner ring electrode 25$^b$ now surrounds a third ring electrode 25$^c$. Ring electrode 25$^c$ surrounds the central part of the doped layer 23, and will thus receive all electrons generated in the surrounded central part of layer 23 of the detector. This induces a signal $S_0$ in the form of current $I_0$, corresponding to the bright field signal.

Ring electrode 25$^b$ and outer ring electrode 25$^a$ are both split in four quadrants, thereby bordering a sector of layer 24. Hereby it can be detected not only on which radius (corresponding to a scatter angle), but also in which quadrant a particle impinges. This may give useful information when observing e.g. crystallographic samples, in which the scatter angle shows variations in certain directions.

To avoid cross-talk between the sectors the layer 24, which as earlier mentioned is a layer with a constant sheet resistance, shows insulation along lines 29.

Figure 4:
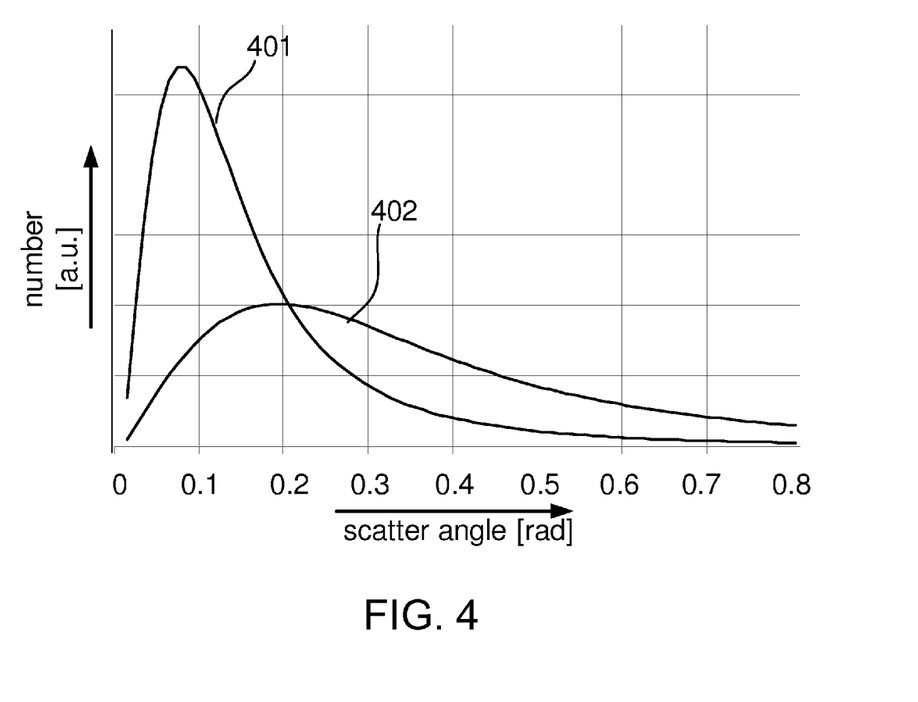
FIG. 4 schematically shows the scatter angle in a thin film of low-Z material and a high-Z material.

It is noted that, for improved cross-talk isolation between the bright field detector and the dark field inner signals, an extra guard electrode may be positioned between 25$^c$ and 25$^b$ FIG. 4 schematically shows the scatter angle in a thin film of low-Z material and a high-Z material.

It is well known that the scattering of electrons in a thin film of low-Z material results in smaller scattering angles than in a thin high-Z film. Thin in this context is a thickness sufficiently small that most scatter events are single scatter events. As a result, when detecting the number of particles scattered between an angle $\alpha$ and $\alpha+\Delta\alpha$, curves as shown in FIG. 4 are found, in which 401 corresponds with electrons scattered by a low-Z material, such as carbon or silicon, and 402 corresponds to the amount scattered by a high-Z material such as gold or copper.

By now scanning a beam of electrons over the sample and determining the average scatter angle for the different positions where the beam dwells, an image representing material contrast can be formed.

It is noted that the scatter angle of each impinging particle, also referred to as an event, can be determined when the detector is sufficiently fast to determine the ratio of $S_1$ and $S_2$ within one such an event, but that alternatively the average scatter angle of a large number of events can be determined.

It is further noted that, as known to the person skilled in the art, a similar angular dependency occurs when the thickness of the film varies. For film thicknesses where mainly single scatter events occur, the electrons are scattered over a smaller angle than for film thicknesses where a considerable fraction of the scatter events represent multiple scatter events. Hereby determining the average scatter angle for a film of a known material can thus be used to form a map of the film thickness.

We claim:

1. A scanning transmission electron microscope, comprising an electron focusing column producing a beam of electrons along an electron beam axis and scanning the electron beam across a sample;

a dark field detector positioned for receiving electrons transmitted and through the sample and scattered by the sample, the detector having a substantially annular area sensitive to impinging electrons, said substantially annular area arranged around a detector centre, the detector centre intended to be positioned on the electron beam axis of the electron microscope, the impinging electrons causing the formation of positive and negative charge carriers in the detector, the detector having a signal electrode for collecting one type of charge carriers, thus forming a signal proportional to the amount and the energy of the impinging electrons, in which said one type of charge carriers is collected by at least two signal electrodes forming two main signals, $S_1$ and $S_2$, the first signal electrode formed at the inner radius of the annular area and the second signal electrode formed at the outer radius of the annular area, as a result of which a part of said one type of charge carriers, caused by an impinging electron, flows to the first signal electrode forming a main signal $S_1$ and a part of said one type of charge carriers flows to the second signal electrode forming a main signal $S_2$, the sum of the main signals, $S_1+S_2$, proportional to the amount and the energy of the electrons impinging on the annular surface, and the normalized difference of the main signals, $(S_1-S_2)/(S_1+S_2)$, a function of the average distance from the detector centre to the position where the electron impinges on the annular surface.

2. The scanning transmission electron microscope according to claim 1 in which the annular area is divided into sectors, and the two signal electrodes are divided in two sets of sector electrodes, an inner set and an outer set, each sector bordered by one unique sector electrode of the inner set and one unique sector electrode of the outer set, as a result of which each sector producing a corresponding sector signal, and the main signal $S_1$ may be formed by the summation of the signals of the inner sector electrodes and the main signal $S_2$ may be formed by the summation of the signals of the outer sector electrodes.

3. The scanning transmission electron microscope according to claim 1 in which the annular area is part of a semiconductor diode, and the charge carriers are electron-hole pairs formed in the semiconductor.

4. The scanning transmission electron microscope according to claim 1 in which between the signal electrodes a resistive layer is present with a substantially constant sheet resistance, and the annular area has an inner radius $R_1$ and an outer radius $R_2$, as a result of which the normalized difference of the main signals $S_1$ and $S_2$ is given by:

$$\frac{S_1 - S_2}{S_1 + S_2} = 1 - 2 \cdot \frac{\ln R - \ln R_1}{\ln R_2 - \ln R_1}$$

in which R is the average distance from the centre of the detector to the position where the electrons impinge on the annular surface, and $R_1 \leq R \leq R_2$.

5. The scanning transmission electron microscope according to claim 1 in which the detector is further equipped with a bright field detector by forming an additional area sensitive to impinging electrons, said additional area surrounded by the annular surface.

6. A method of using a scanning transmission electron microscope, the method comprising:
providing a scanning transmission electron microscope apparatus in accordance with claim 1,
providing a sample placed on said axis between the objective lens and the dark field detector,
directing the beam of particles towards the sample, and measuring the signal of the dark field detector;
determining the average radial position of the particles impinging on the detector using the two main signals.

7. The method according to claim 6 in which the average radial position is used to distinguish between materials of the sample.

8. The method according to any of claim 6 in which the average radial position is used to estimate the thickness of the sample.

9. A scanning electron microscope, comprising
an electron focusing column producing a beam of electrons along an electron beam axis and scanning the electron beam across a sample;
a dark field detector positioned for receiving electrons from the sample struck by the electron beam, the detector having a substantially annular area sensitive to impinging electrons, said substantially annular area arranged around a detector centre, the detector centre intended to be positioned on the electron beam axis of the electron microscope, the impinging electrons causing the formation of positive and negative charge carriers in the detector, the detector having a signal electrode for collecting one type of charge carriers, thus forming a signal proportional to the amount and the energy of the impinging electrons,
in which said one type of charge carriers is collected by at least two signal electrodes forming two main signals, $S_1$ and $S_2$, the first signal electrode formed at the inner radius of the annular area and the second signal electrode formed at the outer radius of the annular area, as a result of which a part of said one type of charge carriers, caused by an impinging electron, flows to the first signal electrode forming a main signal $S_1$ and a part of said one type of charge carriers flows to the second signal electrode forming a main signal $S_2$, the sum of the main signals, $S_1+S_2$, proportional to the amount and the energy of the electrons impinging on the annular surface, and the normalized difference of the main signals, $(S_1-S_2)/(S_1+S_2)$, a function of the average distance from the detector centre to the position where the electron impinges on the annular surface.

10. The scanning electron microscope according to claim 9 in which the annular area is divided into sectors, and the two signal electrodes are divided in two sets of sector electrodes, an inner set and an outer set, each sector bordered by one unique sector electrode of the inner set and one unique sector electrode of the outer set, as a result of which each sector producing a corresponding sector signal, and the main signal $S_1$ may be formed by the summation of the signals of the inner sector electrodes and the main signal $S_2$ may be formed by the summation of the signals of the outer sector electrodes.

11. The scanning electron microscope according to claim 9 in which the annular area is part of a semiconductor diode, and the charge carriers are electron-hole pairs formed in the semiconductor.

12. The scanning electron microscope according to claim 9 in which between the signal electrodes a resistive layer is present with a substantially constant sheet resistance, and the annular area has an inner radius $R_1$ and an outer radius $R_2$, as a result of which the normalized difference of the main signals $S_1$ and $S_2$ is given by:

$$\frac{S_1 - S_2}{S_1 + S_2} = 1 - 2 \cdot \frac{\ln R - \ln R_1}{\ln R_2 - \ln R_1}$$

in which R is the average distance from the centre of the detector to the position where the electrons impinge on the annular surface, and $R_1 \leq R \leq R_2$.

13. The scanning electron microscope according to claim 9 in which the detector is further equipped with a bright field detector by forming an additional area sensitive to impinging electrons, said additional area surrounded by the annular surface.

* * * * *